United States Patent
Schoisswohl

(10) Patent No.: US 7,512,279 B2
(45) Date of Patent: Mar. 31, 2009

(54) SYSTEM, METHOD AND COMPUTER INSTRUCTIONS FOR COMPRESSION OF FOUR DIMENSIONAL DATA

(75) Inventor: Armin Schoisswohl, Wels (AT)

(73) Assignee: General Electric Company, Schenectady, NY (US)

( * ) Notice: Subject to any disclaimer, the term of this patent is extended or adjusted under 35 U.S.C. 154(b) by 651 days.

(21) Appl. No.: 11/158,425

(22) Filed: Jun. 22, 2005

(65) Prior Publication Data

US 2006/0291731 A1  Dec. 28, 2006

(51) Int. Cl.
G06K 9/36 (2006.01)
(52) U.S. Cl. ...................................... 382/232
(58) Field of Classification Search .............. 382/131, 382/232, 234–236, 238–240, 243; 375/240, 375/240.02, 240.12, 240.13; 348/384.1, 348/394.1, 404.1, 409.1–416.1, 424.2; 715/757; 345/419–420, 422, 424; 600/447
See application file for complete search history.

(56) References Cited

U.S. PATENT DOCUMENTS

| | | | |
|---|---|---|---|
| 6,483,874 B1 * | 11/2002 | Panusopone et al. ... | 375/240.08 |
| 6,546,146 B1 * | 4/2003 | Hollinger et al. ............ | 382/253 |
| 6,755,787 B2 * | 6/2004 | Hossack et al. ............. | 600/447 |
| 6,803,910 B2 * | 10/2004 | Pfister et al. ................ | 345/420 |
| 6,864,903 B2 * | 3/2005 | Suzuki ........................ | 715/757 |
| 6,907,073 B2 * | 6/2005 | Sawhney et al. ....... | 375/240.14 |
| 7,324,594 B2 * | 1/2008 | Lamboray et al. ...... | 375/240.03 |

OTHER PUBLICATIONS

Extension of wavelet compression algorithms to 3D and 4D image data: exploitation of data coherence in higher dimensions allows very high compression ratios, by Li Zeng, Christian Jansen, Michael A. Unser and Patrick Hunziker; published in Wavelets: Applications in Signal and Image Processing IX, Andrew F. Laine, Michael A. Unser and Akram Aldroubi, Editors, Proceedings of SPIE vol. 4478 (2001), p. 427-433.

Volumetric medical image compression with three-dimensional wavelet transform and octave zerotree coding, by Jiebo Luo, Xiaohui Wang, Chang W.Chen and Kevin J. Parker, published in Visual Communications and Image Processing '96, Rashid Ansari and Mark J. Smith, Editors, Proceedings of SPIE vol. 2727 (1996), p. 579-590.

Wavelet compression of 3D ultrasound data, by O. Scherzer, A. Schoisswohl and A. Kratochwill, published on Apr. 13, 1999 by the Industrial Mathematics Institute, University of Linz, Austria.

* cited by examiner

Primary Examiner—Jose L Couso
(74) Attorney, Agent, or Firm—McAndrews, Held & Malloy, Ltd.; Peter J. Vogel; Michael A. Dellapenna

(57) ABSTRACT

Certain embodiments of the present invention provide a system, method and computer instructions for compression of four dimensional data. In an embodiment, a system for compression of four dimensional data includes: a compression module configured to compress four dimensional data, wherein the data includes a first three dimensional volume and a second three dimensional volume, and wherein the compression module compresses the data by compressing the first volume and compressing a difference between the first volume and the second volume. In an embodiment, the data may further include a third three dimensional volume and the compression module may further compress the data by compressing a difference between the second volume and the third volume, for example. The system for compression of four dimensional data may also include, an input module(s), a decompression module and an output module(s), for example.

21 Claims, 4 Drawing Sheets

SYSTEM, METHOD AND COMPUTER INSTRUCTIONS FOR COMPRESSION OF FOUR DIMENSIONAL DATA

BACKGROUND OF THE INVENTION

The present invention generally relates to a system, method and computer instructions for compression of four dimensional ("4D") data. More particularly, the present invention relates to a system, method and computer instructions for compressing 4D data, wherein the data includes a first three dimensional volume and a second three dimensional volume, and wherein the data is compressed by compressing the first volume and compressing a difference between the first volume and the second volume. Further, the present invention relates to a system, method and computer instructions for compressing 4D data, wherein the data further includes a third three dimensional volume and the data is further compressed by compressing a difference between the second volume and the third volume, for example.

Technological advances in imaging have brought dynamic three dimensional ("3D") imaging into existence. Dynamic 3D images show a 3D image over a period of time. At any point in time, the 3D image is represented by a volume. Together, all volumes over a period of time make up a sequence. Inasmuch, a sequence shows a 3D image over a period of time. Data generated by capturing a dynamic 3D image is called dynamic 3D data. Dynamic 3D data is also known as 4D data.

While all data has storage requirements, 4D data usually requires more storage than traditional data types, such as (non-dynamic) 3D data and two dimensional ("2D") data. Storage requirements become important when data is transferred and/or stored. Data that requires more storage is a larger burden on networks when transferred. This may become a problem when networks with limited bandwidth become overburdened. Further, data that requires more storage takes up more space in memory when stored. This may become a problem when the storage space of a computing device and/or any other device with memory becomes full.

One solution to this problem is data compression. Data compression reduces the storage requirements of data. Some types of data compression preserve the characteristics of data exactly. Other types of data compression do not preserve the characteristics of data exactly. Types of data compression that do not preserve the characteristics of data exactly are often referred to as lossy compression.

The effectiveness of any data compression method usually turns on two metrics. The first metric is compression speed, or the amount of time required to compress the data. The second metric is compression efficiency, or the amount of storage space that can be saved by applying the compression method. These two metrics often have an inverse relationship. Where one compression method may be fast, it may only reduce storage requirements by a small amount. Where another compression method may be slow, it may reduce storage requirements by a greater amount.

A third metric becomes important when dealing with lossy compression. The third metric is data loss. As mentioned above, lossy compression techniques do not preserve the characteristics of data exactly. However, lossy compression techniques usually aspire to preserve data such that losses of data are not significant. When losses of data are significant, imperfections in the data (due to data lost during compression) become perceptible. Perceptible imperfections in data are often referred to as artifacts.

Methods for compressing (non-dynamic) 3D data are known. Some examples of methods for compressing (non-dynamic) 3D data are 3D wavelet compression and video compression (2D+time). Likewise, methods for compressing 4D data are known. One example is 4D wavelet compression.

However, known methods for compressing 4D data have drawbacks. For example, some 4D compression methods, such as 4D wavelet compression, are efficient (greatly reduce the storage requirements of 4D data), but take a long time to compress the data. In other words, such compression methods are computationally expensive. In another example, 3D compression methods may be applied to compress 4D data. However, while using a 3D compression method to compress a volume in a sequence may be relatively fast when compared to a 4D compression method, existing 3D compression methods that do so do not make use of redundancy in the sequence and thus have low compression efficiency. In other words, existing applications of 3D compression methods to compress 4D data do not reduce storage requirements as much as may be desired.

Thus, there is a need for a system, method and computer instructions for compression of 4D data that is both fast and efficient. Further, with regard to lossy compression, there is a need for a system, method and computer instructions for compression of 4D data that is fast, efficient and provides control over the amount of information lost during compression.

BRIEF SUMMARY OF THE INVENTION

Certain embodiments of the present invention provide a system, method and computer instructions for compression of four dimensional data. In an embodiment, a system for compression of four dimensional data includes: a compression module configured to compress four dimensional data, wherein the data includes a first three dimensional volume and a second three dimensional volume, and wherein the compression module compresses the data by compressing the first volume and compressing a difference between the first volume and the second volume. In an embodiment, the data may further include a third three dimensional volume and the compression module may further compress the data by compressing a difference between the second volume and the third volume, for example. The system for compression of four dimensional data may also include, an input module(s), a decompression module and an output module(s), for example.

In an embodiment, a method for compression of four dimensional data includes: providing four dimensional data, wherein the data includes a first three dimensional volume and a second three dimensional volume; compressing the first volume; and compressing a difference between the first volume and the second volume. In an embodiment, the data may further include a third three dimensional volume and the method may further include compressing a difference between the second volume and the third volume, for example. The method for compression of four dimensional data may also include inputting four dimensional data, outputting compressed data, inputting compressed data, decompressing data and outputting decompressed data, for example.

In an embodiment, a computer-readable storage medium includes a set of instructions for a computer directed to compressing four dimensional data. The set of instructions includes: a compression routine configured to compress four dimensional data, wherein the data includes a first three dimensional volume and a second three dimensional volume, and wherein the compression module compresses the data by compressing the first volume and compressing a difference between the first volume and the second volume. In an embodiment, the data may further include a third three dimensional volume and the compression routine may further compress the data by compressing a difference between the second volume and the third volume, for example. The set of instructions may also include, an input routine(s), a decompression routine and an output routine(s), for example.

Figure 1:
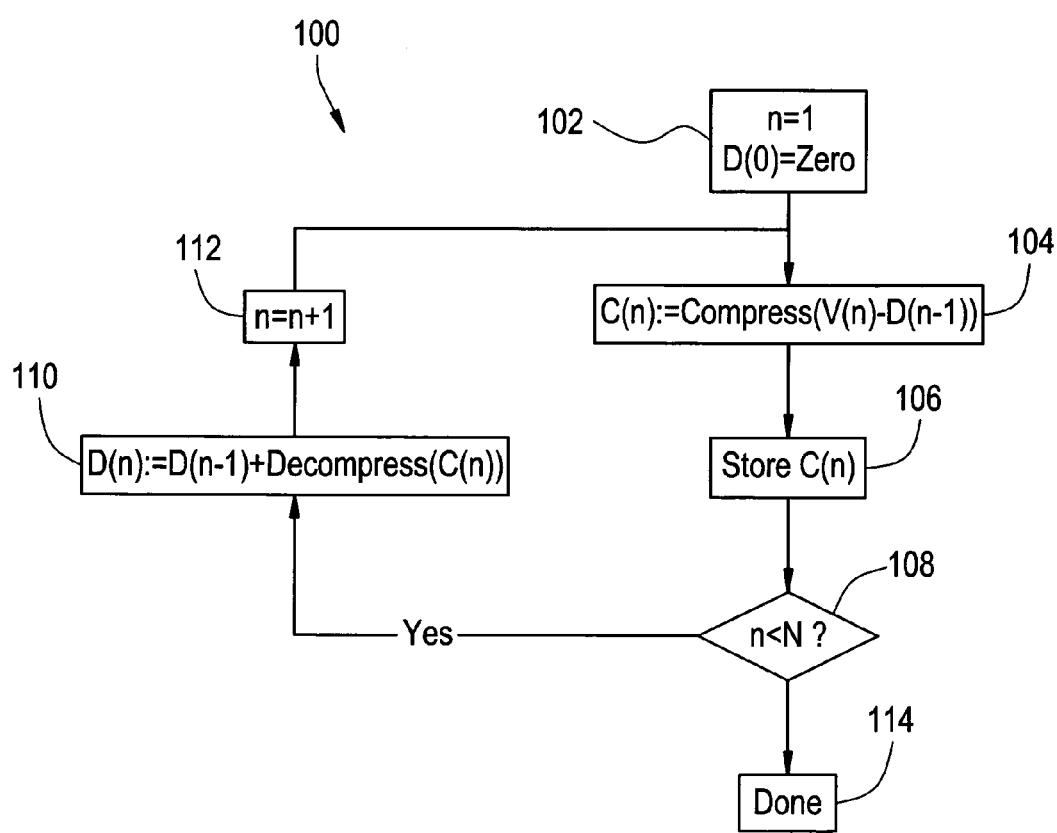
FIG. 1 illustrates a method for compressing four dimensional data used in accordance with an embodiment of the present invention.

The foregoing summary, as well as the following detailed description of embodiments of the present invention, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF CERTAIN EMBODIMENTS

FIG. 1 illustrates a method 100 for compressing four dimensional ("4D") data used in accordance with an embodiment of the present invention. Specifically, FIG. 1 illustrates a method 100 of compressing 4D data that utilizes a compression technique that does not preserve the characteristics of data exactly, also known as a lossy compression technique. In the method 100, 4D data that includes a first three dimensional ("3D") volume and a second three dimensional volume is compressed by compressing the first volume and compressing the difference between: a decompressed version of the first volume, and the second volume prior to compression. In an embodiment, the data may further include a third three dimensional volume and the data may be further compressed by compressing the difference between: a decompressed version of the second volume, and the third volume prior to compression. In other embodiments, the data may further include any number of three dimensional volumes and the data may be further compressed in a similar manner.

In the method 100, 4D data represents a sequence of 3D volumes. The volumes are numbered 1 to N, where N represents the total number of volumes in the sequence. The position of a volume in the sequence is represented by the letter n. V(n) represents the volume at position n. C(n) represents the compressed version of the volume at position n. D(n) represents the decompressed version of the volume at position n.

At 102, n=1. In other words, the equations in the method 100 will be applied to compress the volume in the first position of the sequence. This remains true until the value of n changes.

At 102, D(0)=0. In other words, the decompressed version of the volume at position zero equals zero.

At 104, C(n):=Compress (V(n)−D(n−1)). In other words, the compressed version of the volume at position n (C(n)) is set equal to the compressed version of the volume at position n (V(n)) minus the decompressed version of the volume at position n minus one (D(n−1)).

At 106, C(n) is stored.

At 108, n is compared to N. If n is less than N, D(n) is calculated at 110. If n is not less than N, compression is complete at 114.

At 110, D(n):=D(n−1)+Decompress(C(n)). In other words, the decompressed version of the volume at position n (D(n)) is set equal to the decompressed version of the volume at position n minus one (D(n−1)) plus the decompressed version of the compressed version of the volume at position n.

At 112, n=n+1. In other words, n is incremented by one.

At 114, compression is complete.

Applying the method 100, 4D data may be represented by a sequence including 3 volumes, such that N (the total number of volumes in the sequence)=3. In such an embodiment, the method 100 may be applied to compress the 4D data. Stepping through this example yields the following.

At 102, n=1 and D(0)=0.
At 104, C(1) is set equal to Compress (V(1)−D(0)).
At 106, C(1) is stored.
At 108, 1<3 is true.
At 110, D(1) is set equal to D(0)+Decompress(C(1)).
At 112, n=1+1=2.
At 104, C(2) is set equal to Compress (V(2)−D(1)).
At 106, C(2) is stored.
At 108, 2<3 is true.
At 110, D(2) is set equal to D(1)+Decompress(C(2)).
At 112, n=2+1=3.
At 104, C(3) is set equal to Compress (V(3)−D(2)).
At 106, C(3) is stored.
At 108, 3<3 is false.
At 114, compression is complete.

In an alternative embodiment, 4D data may be represented by a sequence including any number of volumes.

In an alternative embodiment, a compression technique that preserves the characteristics of data exactly may be utilized. In such an embodiment, the method 100 may be changed in the following ways, for example. At 104, C(n):=Compress (V(n)−V(n−1)). In other words, the compressed version of the volume at position n (C(n)) may be set equal to the compressed version of the volume at position n (V(n)) minus the volume at position n−1 (V(n−1)) Further, 110 may be omitted in such an embodiment, for example.

In an alternative embodiment, 4D data may be compressed in an order opposite of that described with regard to FIG. 1. In such an embodiment, a last volume in a sequence may be compressed first and the compression method 100 of FIG. 1 may be applied with n decrementing until N=1, for example.

In an alternative embodiment, only a portion of 4D data may be compressed. In such an embodiment, a volume(s) at the beginning, middle and/or end of a sequence may not be compressed, for example. A volume at the beginning of a sequence may not be compressed by assigning n an initial value that is greater than 1, for example. A volume at the end of a sequence may not be compressed by moving to 114 (done) if n equals a number that is less than N, for example. A volume in the middle of a sequence may not be compressed by inserting a step between 112 and 104 that loops back to 112 if n is equal to the position of a volume that should not be compressed, for example. Not compressing a volume in the middle of the sequence may also require replacing D(n) with a place holder that is independent of n, for example.

In an alternative embodiment, incremental compression of volumes may be applied. In such an embodiment, only every other volume may be compressed and the rest of the volumes may be discarded, for example. In such an embodiment, the method 100 may be changed in the following ways, for example. At 104, D(n−1) may be replaced by D(n−2). At 110, D(n−1) may be replaced by D(n−2). At 112, n=n+1 may be replaced by n=n+2. Similarly, incremental compression of volumes may be applied such that only every third (fourth, fifth, etc.) volume is compressed, for example.

In an alternative embodiment, 4D data may be compressed until a target size is reached. In such an embodiment, a counter may track the size reduction achieved by compressing a volume and then a decision whether to continue compressing may be made by comparing the target size to the current size, for example.

In an alternative embodiment, 4D data may be compressed until a target amount of time is reached. In such an embodiment a timer may track the amount of time spent compressing the data and compression may be terminated when the target amount of time is reached, for example.

Figure 2:
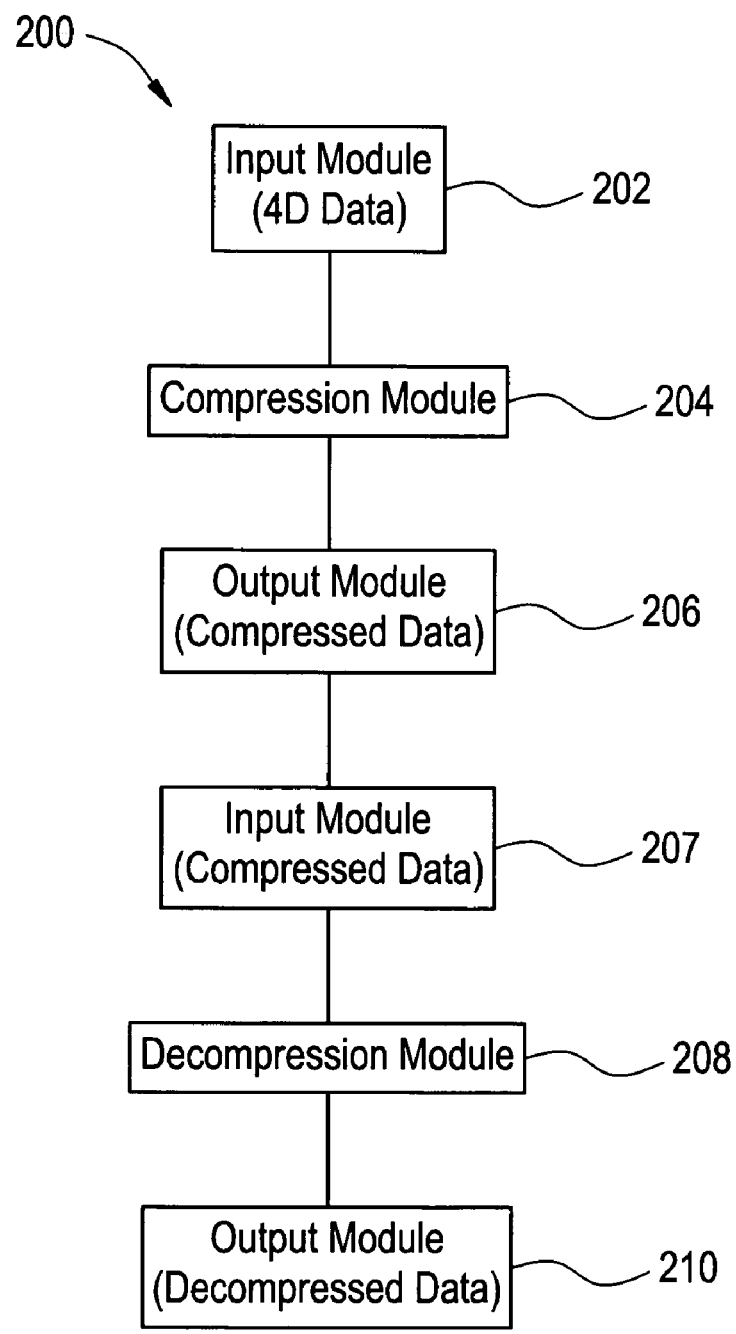
FIG. 2 illustrates a system for compressing four dimensional data used in accordance with an embodiment of the present invention.

FIG. 2 illustrates a system 200 for compression of 4D data used in accordance with an embodiment of the present invention. The system 200 in FIG. 2 includes an input module 202, for allowing 4D data to be input, a compression module 204, for compressing 4D data, an output module 206, for outputting compressed data, an input module 207, for inputting compressed data, a decompression module 208, for decompressing compressed data, and an output module 210, for outputting decompressed data.

In the system 200, the input module 202 allows 4D data to be input. The input module 202 may be configured to allow 4D data to be input in many ways. For example, the input module 202 may be configured to allow 4D data to be input as a computer file. The input module 202 may also be configured to allow 4D data to be input directly from a system and/or workstation that generates 4D data, such as an Ultrasound imaging system, for example. It may be desirable to configure the input module 202 to allow 4D data to be input in other ways, as known to those skilled in the art.

In the system 200, the compression module 204 compresses 4D data. The compression module 204 may be configured to compress 4D data in many ways. For example, the compression module 204 may be configured to compress 4D data by utilizing the method 100 for compressing 4D data described in relation to FIG. 1. The compression module 204 may also be configured to compress 4D data by utilizing alternative embodiments of the method 100 for compressing 4D data described in relation to FIG. 1, such as those described above, for example. It may be desirable to configure the compression module 204 to compress 4D data in other ways, as known to those skilled in the art.

In the system 200, the output module 206 outputs compressed data. The output module 206 may be configured to output compressed data in many ways. For example, the output module 206 may be configured to output compressed data as a computer file and/or an electronic mail. The output module 206 may also be configured to output compressed data to local memory, a portable memory device and/or a remote system and/or workstation, for example. It may be desirable to configure the output module 206 to output compressed data in other ways, as known to those skilled in the art.

In the system 200, the input module 207 allows compressed data to be input. The input module 207 may be configured to allow compressed data to be input in many ways. For example, the input module 207 may be configured to allow compressed data to be input as a computer file and/or an electronic mail. The input module 207 may also be configured to allow compressed data to be input from various sources, such as local memory, a portable memory device and/or a remote system and/or workstation, for example. It may be desirable to configure the input module 207 to allow compressed data to be input in other ways, as known to those skilled in the art.

In the system 200, the decompression module 208 decompresses compressed data. The decompression module 208 may be configured to decompress data in many ways. For example, the decompression module may be configured to decompress data that has been compressed utilizing the method 100 for compressing 4D data described in relation to FIG. 1. The decompression module 208 may also be configured to decompress data that has been compressed utilizing alternative embodiments of the method 100 for compressing 4D data described in relation to FIG. 1, such as those described above, for example. It may be desirable to configure the decompression module 208 to decompress data in other ways, as known to those skilled in the art.

In the system 200, the output module 210 outputs decompressed data. The output module 210 may be configured to output decompressed data in many ways. For example, the output module 210 may be configured to output decompressed data as a computer file, a visual display, printed matter, a facsimile transmission and/or an electronic mail. It may be desirable to configure the output module 210 to output decompressed data in other ways, as known to those skilled in the art.

The modules of the system 200 may be implemented in many ways. For example, the modules may be implemented in hardware and/or software. The modules may be implemented separately and/or integrated in various combinations. Other desirable ways to implement the modules of the system 200 may exist, as known to those skilled in the art.

The system 200 may also be implemented in many ways. For example, the system 100 may be integrated with previously installed software applications as an add-on product. The system 200 may be integrated with systems and workstations connected to a Hospital Information System (HIS) and/or a Radiology Information System (RIS), such as an Ultrasound imaging workstation, a Computed Tomography (CT) imaging system, a Magnetic Resonance (MR) imaging system, and/or a Picture Arching and Communicating System (PACS), for example. The system 200 may be implemented in other ways on other types of systems and/or workstations, as known to those skilled in the art.

In operation, the system 200 may be implemented in connection with an ultrasound system and/or workstation. In such an embodiment, the input module 202 may be configured so that data may be input from an ultra-sound front-end. Input data may then be transferred via Direct Memory Access (DMA) to a computer's Random Access Memory (RAM). Once the 4D data is in RAM, the data may be compressed using the compression module 204. The compression module may utilize the method described in connection with FIG. 1 coupled with a 3D compression technique, such as 3D wavelet compression. Next, the output module 206 may be used to store data in long-term memory, such as on a hard disc or portable memory storage device, or transfer data over a network. In some embodiments, 4D data may not be compressed until a user chooses to store or transfer the 4D data. When compressed data is retrieved, the compressed data may be input into the input module 207. Then, the decompression module 208 may be utilized to decompress the data. The decompression module 208 may be configured to decompress the data using an inverse method of the method used to compress the data. Finally, the output module 210 may be used to output the decompressed data to a screen.

Figure 3:
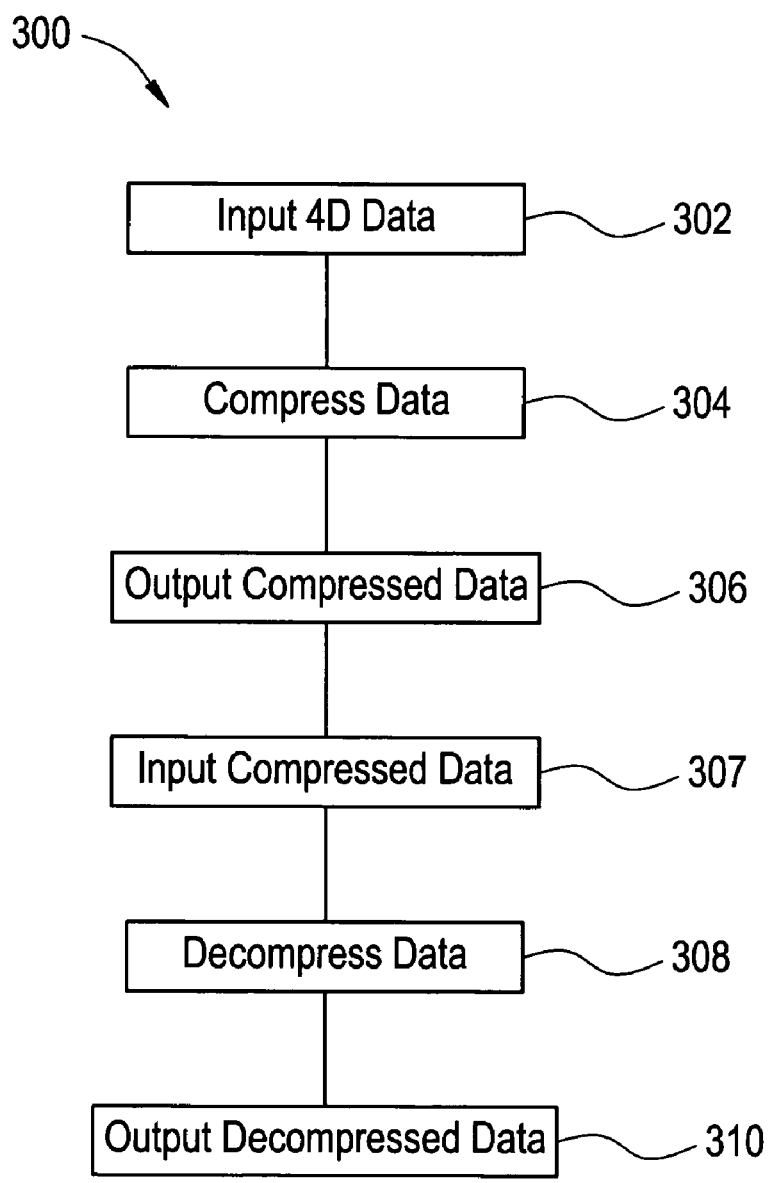
FIG. 3 illustrates a method for compressing four dimensional data used in accordance with an embodiment of the present invention.

FIG. 3 illustrates a method 300 for compressing four dimensional data used in accordance with an embodiment of the present invention. At 302, 4D data may be input. For example, data may be input using the front end of an ultrasound workstation and/or system. Once data is input, the data may be transferred via DMA to a computer's RAM. At 304, 4D data stored in RAM may be compressed. For example, the method described in connection with FIG. 1 coupled with a 3D compression technique, such as 3D wavelet compression, may be utilized to compress the data. At 306, the compressed data may be output to a long-term memory device, such as a hard disc or a portable memory storage device, or transferred over a network. In some embodiments, 4D data may not be compressed until a user chooses to store or transfer the 4D data. At 307, compressed data that has been retrieved may be input. At 308, compressed data may be decompressed. For example, an inverse method of the method used to compress the data may be applied to decompress the data. At 310, data may be output. For example, decompressed data may be output to a screen.

Due to the storage requirements of 4D data, it may be necessary to compress the data before storing and/or transferring the data. Applying the method 300, as described above and/or in light of the description of FIGS. 1 and 2, may provide fast and efficient compression of 4D data. Further, with regard to lossy compression, applying the method 300, as described above and/or in light of the description of FIGS. 1 and 2, may provide fast and efficient compression of 4D data as well as control over the amount of information lost during compression.

Figure 4:
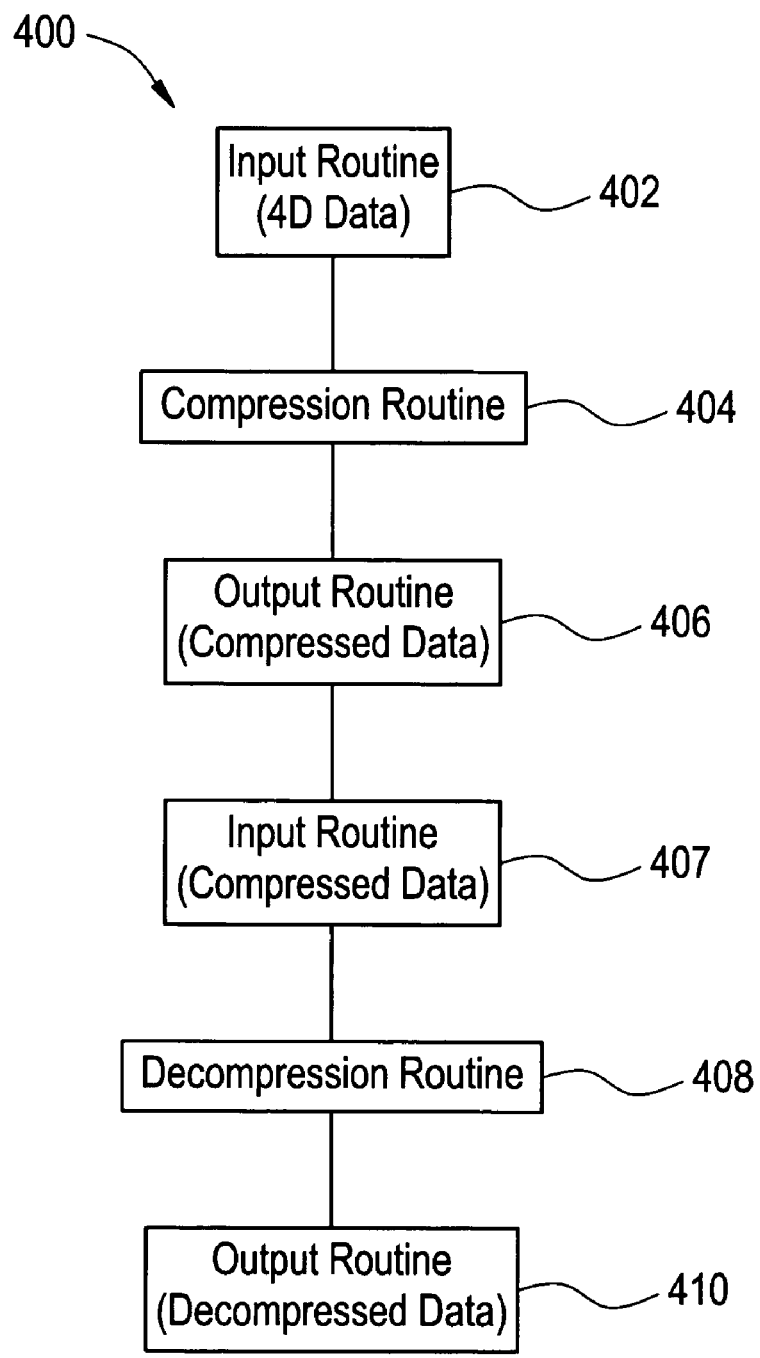
FIG. 4 illustrates a set of computer instructions for compressing four dimensional data used in accordance with an embodiment of the present invention.

FIG. 4 illustrates a set of computer instructions 400 for compressing 4D data used in accordance with an embodiment of the present invention. The set of computer instructions 400 in FIG. 4 includes an input routine 402, for allowing 4D data to be input, a compression routine 404, for compressing 4D data, an output routine 406, for outputting compressed data, an input routine 407, for inputting compressed data, a decompression routine 408, for decompressing compressed data, and an output routine 410, for outputting decompressed data.

In an embodiment, the input routine 402, the compression routine 404, the output routine 406, the input routine 407, the decompression routine 408 and the output routine 410 may be implemented and/or may perform functions similar to the input module 202, the compression module 204, the output module 206, the input module 207, the decompression module 208 and the output module 210, respectively, as described above in relation to FIG. 2.

While the invention has been described with reference to embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. A system for compressing four dimensional data, said system including:
    a compression hardware module configured to compress four dimensional data, wherein said data includes a first three dimensional volume and a second three dimensional volume,
    and wherein said compression module is configured to:
    compress the first volume utilizing a compression technique that does not preserve the characteristics of data exactly,
    decompress the first volume, thereby providing a second version of the first volume that does not include the exact data of the first volume prior to compression, and
    compress a difference between the second volume and the second version of the first volume utilizing a compression technique that does not preserve the characteristics of data exactly.

2. The system of claim 1, wherein said data further includes a third three dimensional volume,
    and wherein said compression module is configured to:
    decompress the difference between the second volume and the second version of the first volume, thereby providing a second version of the difference that does not include the exact data of the difference prior to compression,
    add the second version of the difference to the second version of the first volume, thereby providing a second version of the second volume that does not include the exact data of the second volume prior to compression, and
    compress a difference between the third volume and the second version of the second volume utilizing the compression technique that does not preserve the characteristics of said data exactly.

3. The system of claim 1, further including an input module configured to allow said data to be input.

4. The system of claim 1, further including an output module configured to output compressed data.

5. The system of claim 1, further including:
    a decompression module configured to decompress compressed data; and
    an output module configured to output at least one of: compressed data and decompressed data.

6. A method for compressing four dimensional data that includes a plurality of three dimensional volumes, said method including: using a processor to implement the steps of
    compressing a first three dimensional volume utilizing a compression technique that does not preserve the characteristics of data exactly,
    decompressing the first volume, thereby providing a second version of the first volume that does not include the exact data of the first volume prior to compression, and
    compressing a difference between a second three dimensional volume and the second version of the first volume utilizing a compression technique that does not preserve the characteristics of data exactly.

7. The method of claim 6, further comprising:
    decompressing the difference between the second volume and the second version of the first volume, thereby providing a second version of the difference that does not include the exact data of the difference prior to compression,
    adding the second version of the difference to the second version of the first volume, thereby providing a second version of the second volume that does not include the exact data of the second volume prior to compression, and
    compressing a difference between a third three dimensional volume and the second version of the second volume utilizing the compression technique that does not preserve the characteristics of said data exactly.

8. The method of claim 6, further including inputting said data.

9. The method of claim 6, further including outputting compressed data.

10. The method of claim 6, further including:
decompressing compressed data; and
outputting at least one of: compressed data and decompressed data.

11. A computer-readable storage medium including a set of instructions for a computer, the set of instructions comprising:
a compressions routine configured to compress four dimensional data, wherein said data includes a first three dimensional volume and a second three dimensional volume,
and wherein said compression routine is configured to;
compress the first volume utilizing a compression technique that does not preserve the characteristics of data exactly,
decompress the first volume, thereby providing a second version of the first volume that does not include the exact data of the second volume prior to compression, and
compress a difference between the second volume and the second version of the first volume utilizing a compression technique that does not preserve the characteristics of data exactly.

12. The set of instructions of claim 11, wherein said data further includes a third three dimensional volume,
and wherein said compression routine is configured to:
decompress the difference between the second volume and the second version of the first volume, thereby providing a second version of the difference that does not include the exact data of the difference prior to compression,
add the second version of the difference to the second version of the first volume, thereby providing a second version of the second volume that does not include the exact data of the second volume prior to compression, and
compress a difference between the third volume and the second version of the second volume utilizing the compression technique that does not preserve the characteristics of said data exactly.

13. The set of instructions of claim 11, further including an input routine configured to allow said data to be input.

14. The set of instructions of claim 11, further including an output routine configured to output compressed data.

15. The set of instructions of claim 11, further including:
a decompression routine configured to decompress compressed data; and
an output routine configured to output at least one of: compressed data and decompressed data.

16. The system of claim 1, wherein the compression module is configured to provide incremental compression of four dimensional data such that at least one three dimensional volume between the first volume and the second volume is discarded.

17. The system of claim 2, wherein the compression module is configured to provide incremental compression of four dimensional data such that at least one three dimensional volume between the first volume and the second volume is discarded and at least one three dimensional volume between the second volume and the third volume is discarded.

18. The method of claim 6, further including discarding at least one three dimensional volume between the first volume and the second volume.

19. The method of claim 7, further including discarding at least one three dimensional volume between the second volume and the third volume.

20. The set of instructions of claim 11, wherein the compression routine is configured to provide incremental compression of four dimensional data such that at least one three dimensional volume between the first volume and the second volume is discarded.

21. The set of instructions of claim 12, wherein the compression routine is configured to provide incremental compression of four dimensional data such that at least one three dimensional volume between the first volume and the second volume is discarded and at least one three dimensional volume between the second volume and the third volume is discarded.

* * * * *